United States Patent
Grede et al.

(10) Patent No.: US 10,615,755 B2
(45) Date of Patent: Apr. 7, 2020

(54) NON-LINEAR HIGH-FREQUENCY AMPLIFIER ARRANGEMENT

(71) Applicant: TRUMPF Huettinger GmbH + Co. KG, Freiburg (DE)

(72) Inventors: Andre Grede, Freiburg (DE); Alexander Alt, Freiburg (DE); Daniel Gruner, Muellheim (DE); Anton Labanc, Ehrenkirchen (DE)

(73) Assignee: TRUMPF Huettinger GmbH + Co. KG, Freiburg (DE)

(*) Notice: Subject to any disclaimer, the term of this patent is extended or adjusted under 35 U.S.C. 154(b) by 262 days.

(21) Appl. No.: 15/854,333

(22) Filed: Dec. 26, 2017

(65) Prior Publication Data
US 2018/0138869 A1 May 17, 2018

Related U.S. Application Data

(63) Continuation of application No. PCT/EP2016/065382, filed on Jun. 30, 2016.

(30) Foreign Application Priority Data

Jun. 30, 2015 (DE) .................. 10 2015 212 152

(51) Int. Cl.
*H03F 1/52* (2006.01)
*H01J 37/32* (2006.01)
(Continued)

(52) U.S. Cl.
CPC ........ *H03F 1/523* (2013.01); *H01J 37/32174* (2013.01); *H01L 23/66* (2013.01);
(Continued)

(58) Field of Classification Search
None
See application file for complete search history.

(56) References Cited

U.S. PATENT DOCUMENTS

| 4,560,851 A | 12/1985 | Tsukamoto et al. |
| 5,691,557 A | 11/1997 | Watanabe |

(Continued)

FOREIGN PATENT DOCUMENTS

| DE | 3240726 | 5/1983 |
| EP | 1691481 | 8/2006 |

(Continued)

OTHER PUBLICATIONS

Beltran, "Class F and inverse class-F power amplifier loading networks design based upon transmission zeros," In: 2014 IEEE MTT-S International Microwave Symposium, 2014, 1-4.

(Continued)

*Primary Examiner* — Alexander H Taningco
*Assistant Examiner* — Srinivas Sathiraju
(74) *Attorney, Agent, or Firm* — Fish & Richardson P.C.

(57) ABSTRACT

A non-linear high-frequency amplifier arrangement suitable for generating power outputs ≥1 kW at frequencies of ≥1 MHz for plasma excitation is provided. The arrangement includes two LDMOS transistors each connected by their source connection to aground connection point, where the LDMOS transistors have the same design and are arranged in an assembly, a power transformer whose primary winding is connected to drain connections of the LDMOS transistors, a signal transformer whose secondary winding is connected by a first end to a gate connection of one LDMOS transistor and by a second end to a gate connection of the other LDMOS transistor, and a feedback path from the drain connection to the gate connection of each of the LDMOS transistors.

9 Claims, 3 Drawing Sheets

(51) Int. Cl.
  *H03F 3/30* (2006.01)
  *H03F 3/193* (2006.01)
  *H03F 3/217* (2006.01)
  *H01L 23/66* (2006.01)
  *H01L 27/06* (2006.01)
  *H01L 29/78* (2006.01)
  *H03F 3/195* (2006.01)

(52) U.S. Cl.
  CPC ...... *H01L 27/0629* (2013.01); *H01L 29/7816* (2013.01); *H03F 3/193* (2013.01); *H03F 3/195* (2013.01); *H03F 3/2176* (2013.01); *H03F 3/3001* (2013.01); *H01L 2223/6616* (2013.01); *H03F 2200/451* (2013.01)

(56) References Cited

U.S. PATENT DOCUMENTS

| | | | |
|---|---|---|---|
| 6,046,641 | A | 4/2000 | Chawla et al. |
| 6,064,249 | A | 5/2000 | Duvvury et al. |
| 6,157,258 | A | 12/2000 | Adishian et al. |
| 6,172,383 | B1 | 1/2001 | Williams |
| 8,237,501 | B2 | 8/2012 | Owen |
| 8,344,801 | B2 | 1/2013 | Owen et al. |
| 9,147,555 | B2* | 9/2015 | Richter ............. H01J 37/32018 |
| 9,276,456 | B2* | 3/2016 | Grede ............... H02M 7/53873 |
| 9,490,752 | B2* | 11/2016 | Briffa .................. H03G 3/3042 |
| 9,684,327 | B2* | 6/2017 | Fritsch ............. H01J 37/32174 |
| 9,768,731 | B2* | 9/2017 | Perreault ................ H03G 3/004 |
| 10,002,749 | B2* | 6/2018 | Grede ............... H01J 37/32944 |
| 10,026,593 | B2* | 7/2018 | Alt .................... H01J 37/32174 |
| 10,038,461 | B2* | 7/2018 | Briffa .................... H03F 1/0216 |
| 10,312,064 | B2* | 6/2019 | Grede ............... H01J 37/32944 |
| 10,348,186 | B2* | 7/2019 | Schuler .................. H02M 1/32 |
| 10,354,839 | B2* | 7/2019 | Alt ...................... H01L 29/7835 |
| 10,354,840 | B2* | 7/2019 | Bock ...................... G05B 11/06 |
| 10,396,720 | B2* | 8/2019 | Grede ..................... H03F 1/565 |
| 2002/0149425 | A1 | 10/2002 | Chawla et al. |
| 2003/0215373 | A1 | 11/2003 | Reyzelman et al. |
| 2006/0158911 | A1 | 7/2006 | Lincoln et al. |
| 2009/0027936 | A1 | 1/2009 | Glueck et al. |
| 2011/0241781 | A1 | 10/2011 | Owen et al. |
| 2014/0167858 | A1 | 6/2014 | Van Zuijlen et al. |
| 2014/0361690 | A1 | 12/2014 | Yamada et al. |
| 2016/0294334 | A1* | 10/2016 | Piel ........................... H03F 1/52 |
| 2016/0300695 | A1* | 10/2016 | Alt .................... H01J 37/32082 |
| 2018/0120889 | A1* | 5/2018 | Grede ..................... G06F 1/022 |
| 2018/0122621 | A1* | 5/2018 | Grede ............... H01J 37/32174 |
| 2018/0123526 | A1* | 5/2018 | Grede ........................ H05K 1/18 |
| 2018/0138864 | A1* | 5/2018 | Grede ............... H01J 37/32174 |
| 2018/0138869 | A1* | 5/2018 | Grede ............... H01J 37/32174 |
| 2018/0301323 | A1* | 10/2018 | Grede ............... H01J 37/32944 |
| 2018/0323040 | A1* | 11/2018 | Alt .................... H01J 37/32082 |

FOREIGN PATENT DOCUMENTS

| | | |
|---|---|---|
| JP | 4248637 B2 | 4/2009 |
| JP | 4271457 | 6/2009 |
| JP | 4271457 B2 | 6/2009 |
| JP | 2013-135159 | 7/2013 |
| WO | WO 2017/001599 | 1/2017 |
| WO | WO 2017/001594 | 5/2017 |

OTHER PUBLICATIONS

Brouk and Heckmann, "Stabilizing RF Generator and Plasma Interactions," 2004 Society of Vacuum Coaters, 47th Annual Technical Conference Proceedings, Apr. 2004, 49-54.

International Search Report and Written Opinion in International application No. PCT/EP2016/065382, dated Oct. 21, 2016, 22 pages. (with English translation).

RF Power LDMOS Transistors High Ruggedness N-Channel Enhancement-Mode Lateral MOSFETs, Freescale Semiconductor Technical Data, 2014, 24 pages.

Skelton, Homebrew Cookbook, Radio Society of Great Britain, 2010, p. 115.

'www.seekic.com' [online]. Apr. 12, 2017 <www.seekic.com/uploadfile/ic-circuit/s200971322422125.gif>. 1 page.

Bloem et al., "Extremely rugged 50 V LDMOS deviced capture ISM and Broadcast markets," NXP, 2013, 24 pages.

Franzis Elektronik: Neue professionelle Schaltungstechnik: 302 neue professionelle Schaltungen. Poing: Franzis Verlag GmbH, 2009, S335 (with English summary).

International Search Report and Written Opinion in International Application No. PCT/EP2016/065376, dated Oct. 26, 2016, 15 pages. (with English translation).

Raab, "Broadband Class-E Power Amplifier for HF and VHF," Microwave Symposium Digest, IEEE, Jun. 2006, 902-905.

RF Power LDMOS Transistors High Ruggedness N-Channel Enhancement-Mode Lateral MOSFETs, Freescale Seminconductor Inc., 2014, 24 pages.

* cited by examiner

NON-LINEAR HIGH-FREQUENCY AMPLIFIER ARRANGEMENT

CROSS REFERENCE TO RELATED APPLICATIONS

This application is a continuation of and claims priority under 35 U.S.C. § 120 from PCT Application No. PCT/EP2016/065382 filed on Jun. 30, 2016, which claims priority from German Application No. DE 10 2015 212 152.6, filed on Jun. 30, 2015. The entire contents of each of these priority applications are incorporated herein by reference.

TECHNICAL FIELD

The invention relates to non-linear, high-frequency amplifier arrangements, e.g., for generating an output power of ≥1 kW at frequencies of ≥1 MHz for plasma excitation.

BACKGROUND

Various amplifier arrangements are shown, for example, in the following documents: US 2014/0167858 A1, US 2006/0158911 A1, U.S. Pat. No. 6,157,258 A, US 2002/0149425 A1, U.S. Pat. No. 6,046,641 A.

Laterally Diffused Metal Oxide Semiconductor (LDMOS) transistors are known, for example, from the following document: Freescale Semiconductor, Technical Data, RF Power LDMOS Transistors, Document Number: MRFE6VP61K25H Rev. 4.1, 3/2014.

Non-linear high-frequency amplifiers are used, inter alia, to generate power suitable for implementing a plasma process. Laterally diffused metal oxide semiconductor (LDMOS) transistors, in particular extra-rugged LDMOS transistors, are suitable for use in amplifiers of this kind, in particular for applications having mismatched load, on account of the ruggedness of said transistors against feedback energy. However, in cases of an extreme mismatch, even a transistor of this kind could swing up and/or be quickly destroyed. This can lead to self-oscillation on account of excessively high amplification at a specific load. Furthermore, an excessively rapid voltage increase may switch on a parasitic bipolar transistor in the metal-oxide-semiconductor field-effect transistor (MOSFET) structure and thereby destroy the transistor.

SUMMARY

One of the objects of the present invention is to provide a high-frequency amplifier arrangement that includes LDMOS transistors and that is stable under a wide variety of different load conditions.

One aspect of the present invention features a non-linear high-frequency (HF) amplifier arrangement suitable for generating output power of ≥1 kW at frequencies of ≥1 MHz for plasma excitation, including: two LDMOS transistors, which are each connected to a ground connection point by their respective source terminals, the LDMOS transistors being embodied alike and being arranged in a package; a power transformer, a primary winding of which is connected to drain terminals of the LDMOS transistors; a signal transformer, a secondary winding of which is connected at a first end to a gate terminal of one LDMOS transistor and at a second end to a gate terminal of the other LDMOS transistor, in particular via a resistor; and a feedback path, in each case, from the drain terminal to the gate terminal of each LDMOS transistor.

This measure (or configuration) makes it possible to prevent the high-frequency amplifier arrangement from undesirably becoming an oscillator when a positive feedback loop having a coupling factor of >1 is closed. A loop of this kind can include: an input network, a transistor, an output network including a load, and/or a feedback. For small-signal amplifiers, there are various criteria for determining the stability. In the case of a non-linear power amplifier, the criteria are not applied and numerical simulation, if a suitable model is available, or experiments are relied on. In the case of a non-linear, high-frequency amplifier, two types of self-oscillation may occur. Self-oscillation may occur in the absence of a drive signal (either entirely autonomously or triggered by a drive signal and oscillation continuing after the drive signal is switched off) (first type of self-oscillation). Furthermore, low-frequency signals can be observed, some of which only have a fraction of the working frequency, e.g., the drive frequency of the transistors, and which only appear at a specific amplitude of the drive signal (second type of self-oscillation). The first type of self-oscillation may involve large amounts of power, which endangers the amplifier. In the second type of self-oscillation, contamination of the output signal occurs. Stabilization can be achieved according to the invention by introducing broadband feedback. This is done by inserting a feedback path from the drain terminal to the gate terminal of an LDMOS transistor.

Broadband feedback can be achieved, for example, in that each feedback path includes a series circuit including a resistor and a capacitor. In this case, the resistor can have a resistance value in the range of, for example, from 200 to 800 ohm, and the capacitor can have a capacitance in the range of, for example, from 0.01 to 5 nF.

Alternatively or additionally, the secondary winding of the signal transformer can be connected at a first end to the gate terminal of one LDMOS transistor by one or more resistive elements, and can be connected at a second end to the gate terminal of the other LDMOS transistor by one or more resistive elements. Providing resistive elements produces "lossy gate wiring." In this way, instabilities resulting from self-oscillation can be effectively prevented.

In some embodiments, it is sufficient to use resistive elements having a low resistance value. For example, resistors having a resistance value in the range of between 1 and 100 ohm can be used as resistive elements. Alternatively or additionally, the drain terminals of the LDMOS transistors can be connected to ground by at least one capacitor in each case. This measure reduces the impedance experienced by the drains at high frequencies. As a result, undesired resonances are suppressed and the risk of failure on account of excessive dV/dt is reduced.

The LDMOS transistors can be optimized for avalanche operation. A surplus of energy produced by overvoltage is converted into heat. As long as the transistor does not overheat as a result of this, it will not be destroyed. The gate-drain capacitance is also very low and the gate is shielded from the electrical field of the drain. As a result, the risk of rapid failure due to switching of the parasitic bipolar transistor is also greatly reduced. In unfavorable load conditions at a high drain current, however, failures can be observed in the amplifier for smaller frequencies, e.g., 13.56 MHz. This can occur when harmonics in the range of from 300 to 400 MHz make up a large proportion of the drain voltage. One solution is to design the output network such that it is low-resistance at these frequencies and such that no high HF drain voltage is generated. If this is not successful, however, it is helpful to provide capacitors from the drains to ground for stabilization purposes. The connection of the drains to ground can be implemented at an extremely low terminal inductance.

Low terminal inductance may, for example, be achieved by connecting the capacitors to ground by a plurality of parallel vias or by through-plating into a heat spreader of the LDMOS transistors. If a high-frequency amplifier is installed on a thin circuit board, the connections of the capacitors to the ground plane may be implemented in a low-inductance manner by a plurality of parallel vias. In the case of a multi-layered circuit board, however, this is difficult. In this case, the low-inductance connection can be achieved by through-plating into the heat spreader of the transistor. The heat spreader is a metal plate that includes the assembly of LDMOS transistors. As a result, heat generated by the transistors can be distributed over a large surface area.

The likelihood of failure of the high-frequency amplifier arrangement can be further reduced by providing a circuit board that lies flat on a metal cooling plate and that is connected to the cooling plate, which can be connected to ground, via a plurality of ground connections. For example, the assembly can be arranged on the circuit board. Heat can therefore be conducted away from the assembly including the LDMOS transistors particularly well. Overheating of the transistors can thus be largely prevented.

Another aspect of the present invention features methods of protecting a high-frequency amplifier arrangement according to the inventions described herein. In these methods, the high-frequency amplifier arrangement is operated as a non-linear amplifier arrangement in a normal mode. A set power is defined as a power supposed (or expected) to be output by the high-frequency amplifier arrangement in the normal mode. When the set power is reduced by more than 50%, the high-frequency amplifier arrangement is operated in a linear mode.

A load having a high quality factor feeds some of the stored energy back into the amplifier after the high-frequency amplifier arrangement has been switched off. Since the LDMOS transistors in this case conduct no or only very little quiescent current, a high-quality oscillating circuit, including the drain capacitor, an output network, and the load, is formed. There is a risk, here, of a parasitic bipolar transistor being switched and the LDMOS transistors thus being destroyed. The countermeasure according to the invention provides for a high-frequency power output by the high-frequency amplifier arrangement to be switched off slowly. This can be achieved by operating the high-frequency amplifier arrangement in a linear mode for a specific period of time.

In this case, the high-frequency amplifier arrangement can be operated in the linear mode over at least two cycles of the output high-frequency power. The LDMOS transistors operate inefficiently during this time. As a result, the fed-back power can be safely converted into heat.

The high-frequency amplifier arrangement can be operated in the linear mode for at least 100 ns. This ensures that the high-frequency amplifier arrangement is switched off without being destroyed.

In the normal mode, the voltage levels of the drive signals for the gates of the LDMOS transistors can be selected such that the transistors are operated at least temporarily in a saturation mode when switched on. In the linear mode, the voltage levels of the drive signals can be selected such that the transistors are not operated in the saturation mode. Therefore, the LDMOS transistors can be set to operate in the saturation mode (e.g., a non-linear amplifier mode) or in a non-saturation mode (e.g., a linear mode) based on the voltage levels of the drive signals. If, for example, the high-frequency amplifier is intended to be switched off, e.g., the set power drops to zero, a transition into a linear mode can first be effected to protect the high-frequency amplifier arrangement.

Further features and advantages of the invention can be found in the following description of embodiments of the invention, with reference to the drawings, which show details essential to the invention, and in the claims. The different features may each be implemented in isolation or together in any desired combinations in variants of the invention.

DESCRIPTION OF DRAWINGS

Embodiments of the invention are shown in the schematic drawings and explained in greater detail in the following description.

In the drawings.

DETAILED DESCRIPTION

Figure 1:
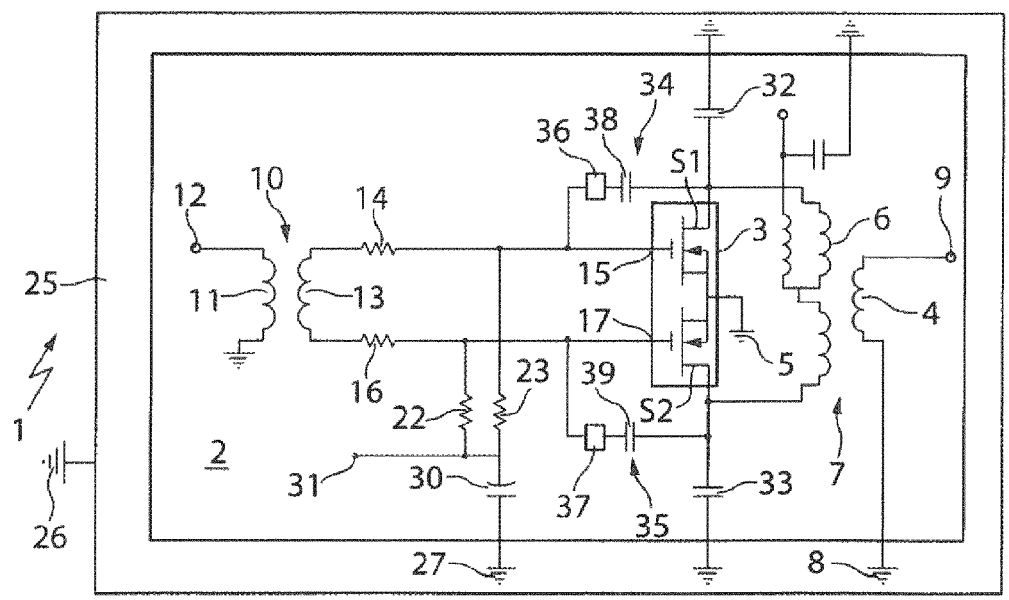
FIG. 1 shows a high-frequency amplifier arrangement according to the invention.

FIG. 1 shows a first embodiment of a high-frequency amplifier arrangement 1. The high-frequency amplifier arrangement 1 includes a circuit board 2 on which a package 3 is arranged. The package 3 includes two LDMOS transistors S1, S2, which are embodied alike and are each connected to a ground connection point 5 by their respective source terminals.

To stabilize the high-frequency amplifier arrangement 1, which can be operated in a non-linear manner, feedback paths 34, 35 are provided from the drain terminals of the LDMOS transistors S1, S2 to the gate terminals 15, 17. The feedback paths 34, 35 each include a series circuit having a resistor 36, 37 and a capacitor 38, 39.

The LDMOS transistors S1, S2 are each connected, by the drain terminals thereof, to an end of a primary winding 6 of a power transformer 7, which is part of an output network. The secondary winding 4 of the power transformer 7 is connected to ground 8 and also connected to a high-frequency output 9. A high-frequency power can be output through the high-frequency output 9, e.g., to a load.

The drain terminals of the LDMOS transistors S1, S2 are in each case connected to ground via a capacitor 32, 33. The connection is achieved by through-plating into a heat spreader of the LDMOS transistors S1, S2.

The high-frequency amplifier arrangement 1 further includes a signal transformer 10, which includes a primary winding 11 that is connected to a high-frequency input 12. A supply power can be provided to the high-frequency amplifier arrangement 1 through the high-frequency input 12. A set power is a power that is supposed to be output or generated by the high-frequency amplifier arrangement 1 in a normal mode. The secondary winding 13 of the signal transformer 10 is connected to the gate terminal 15 of the LDMOS transistor S1 by a resistive element 14, e.g., a resistor. The secondary winding 13 is also connected to the gate terminal 17 of the LDMOS transistor S2 by a resistive element 16, e.g., a resistor. The resistive elements 14, 16 and the secondary winding 13 are therefore connected in series. Just like the power transformer 7, the signal transformer 10 is also arranged on the circuit board 2.

The gate terminals 15, 17 are connected, by resistors 22, 23, to a capacitor 30, which is in turn connected to ground 27. A DC voltage source is connected to the terminal 31.

The circuit board 2 lies flat on a cooling plate 25, which can also be connected to ground 26. In particular, the circuit board 2 is connected to the cooling plate 25 by a plurality of ground connections 8, 27. The ground connection 5 is a ground connection point for transferring heat from LDMOS transistors S1, S2 to the cooling plate 25.

Figure 2A:
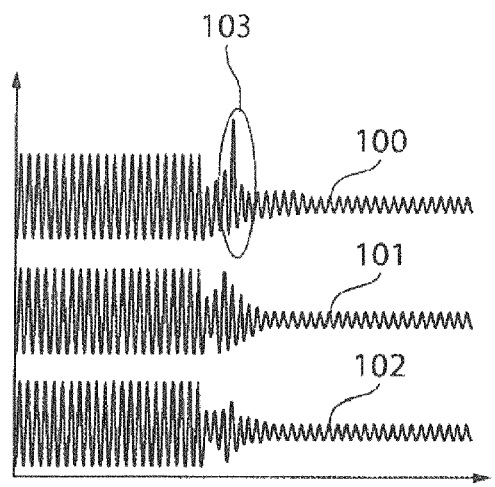
FIG. 2A shows voltage curves of gate voltages and drain voltages of LDMOS transistors when a set power is rapidly reduced.

FIG. 2A shows a drain voltage curve 100 of the first LDMOS transistor S1 and the drain voltage curve 101 of the second LDMOS transistor S2. The gate voltage, by which the LDMOS transistors are driven, is indicated by reference numeral 102. Voltage peaks are indicated by a circle 103 and occur in the drain voltage when the set power is reduced abruptly, in particular when the high-frequency amplifier arrangement is switched off without changing to a linear amplifier mode after being switched off. Said voltage peaks should be avoided.

Figure 2B:
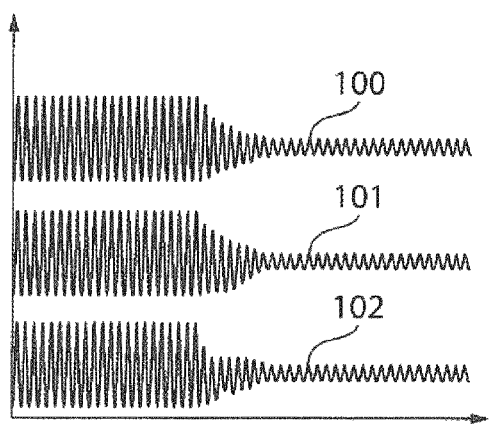
FIG. 2B shows corresponding voltage curves when a set power is rapidly reduced, but the high-frequency amplifier arrangement is still being operated in linear mode.

FIG. 2B shows the corresponding voltages 100, 101, 102 when, during sudden reduction of the set power, there is a transition from a non-linear amplifier mode into a linear amplifier mode. It can be seen in this case that the voltage peaks do not arise in the drain voltages 100, 101, as a result of which the LDMOS transistors are protected.

Figure 3A:
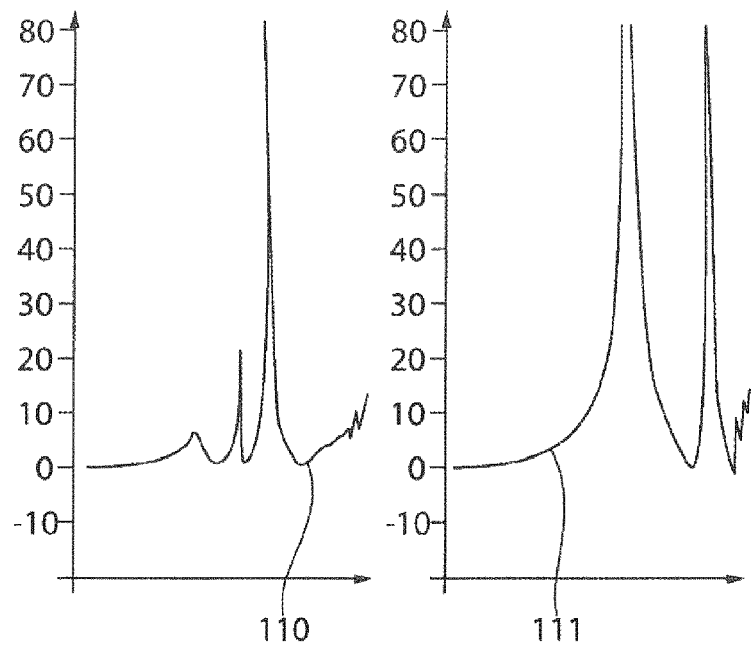
FIG. 3A shows graphs obtained when no capacitors are used between drain and ground.

FIG. 3A shows, on the left-hand side, the differential mode impedance 110 and, on the right-hand side, the common mode impedance 111 of the matching network (as seen from the drains) when no capacitors are provided between drain and ground.

Figure 3B:
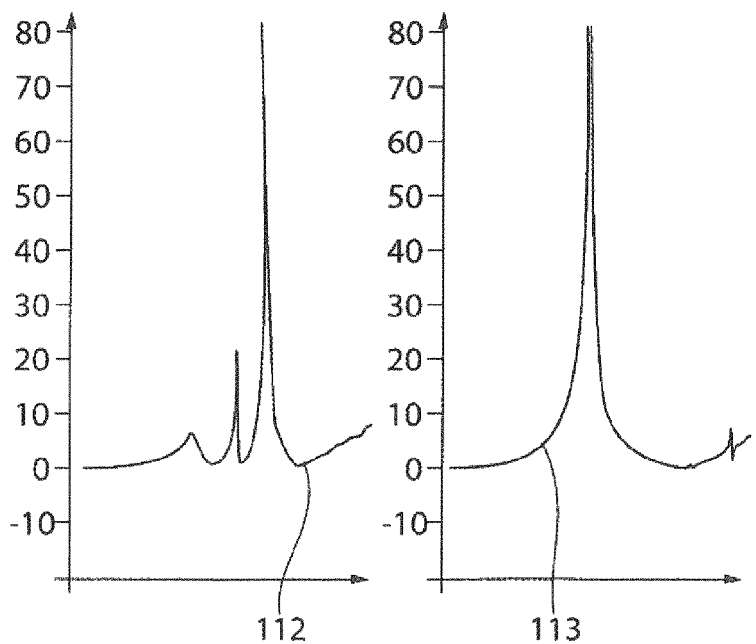
FIG. 3B shows graphs obtained when capacitors are used between drain and ground.

FIG. 3B shows, on the left-hand side, the differential mode impedance 112 and, on the right-hand side, the common mode impedance 113 of the matching network (as seen from the drains) when corresponding capacitors 32, 33 are used.

OTHER EMBODIMENTS

A number of embodiments of the invention have been described. Nevertheless, it will be understood that various modifications may be made without departing from the spirit and scope of the invention. Accordingly, other embodiments are within the scope of the following claims.

What is claimed is:

1. A method of protecting a high-frequency amplifier arrangement, the method comprising:
receiving a supply power by a primary winding of a signal transformer of the amplifier arrangement, wherein a secondary winding of the signal transformer is connected at a first end to a gate terminal of a first Laterally Diffused Metal Oxide Semiconductor (LDMOS) transistor of the amplifier arrangement and at a second end to a gate terminal of a second LDMOS transistor of the amplifier arrangement, wherein each of the first and second LDMOS transistors are connected to a ground connection point by a respective source terminal and to a primary winding of a power transformer of the amplifier arrangement by a respective drain terminal, and wherein the amplifier arrangement comprises a respective feedback path from the respective drain terminal to the respective gate terminal of each of the first and second LDMOS transistors;
operating the high-frequency amplifier arrangement as a non-linear amplifier arrangement in a normal mode, wherein a set power is supposed to be output by the high-frequency amplifier arrangement in the normal mode; and
in response to determining that less than 50% of the set power is to be output, operating the high-frequency amplifier arrangement in a linear mode.

2. The method of claim 1, further comprising outputting a high-frequency power by a secondary winding of the power transformer,
wherein operating the high-frequency amplifier arrangement in the linear mode comprises operating the high-frequency amplifier arrangement in the linear mode over at least two cycles of the high-frequency power.

3. The method of claim 1, wherein operating the high-frequency amplifier arrangement in the linear mode comprises:
operating the high-frequency amplifier arrangement in the linear mode for at least 100 ns.

4. The method of claim 1, wherein operating the high-frequency amplifier arrangement as the non-linear amplifier arrangement in the normal mode comprises:
selecting voltage levels of driver signals for the gate terminals of the LDMOS transistors, such that the LDMOS transistors are operated at least temporarily in a saturation mode when switched on.

5. The method of claim 1, wherein operating the high-frequency amplifier arrangement in the linear mode comprises:
selecting voltage levels of driver signals for the gate terminals of the LDMOS transistors such that the LDMOS transistors are operated in a non-saturation mode.

6. The method of claim 1, wherein each of the respective feedback paths comprises a respective series circuit including a respective resistor and a respective capacitor.

7. The method of claim 1, wherein the secondary winding of the signal transformer is connected at the first end to the gate terminal of the first LDMOS transistor by one or more first resistive elements and is connected at the second end to the gate terminal of the second LDMOS transistor by one or more second resistive elements, such that a lossy gate circuit is produced.

8. The method of claim 1, wherein the drain terminal of each of the LDMOS transistors is respectively connected to ground by at least one capacitor, and
wherein the capacitors are connected to ground by one of a plurality of parallel vias and through-plating into a heat spreader of the LDMOS transistors.

9. The method of claim 1, wherein the LDMOS transistors are in a package on a circuit board that is on a metal cooling plate, and wherein the circuit board is connected to the metal cooling plate by a plurality of ground connections.

* * * * *